(12) United States Patent
Choudhary

(10) Patent No.: US 8,396,441 B1
(45) Date of Patent: Mar. 12, 2013

(54) WIDEBAND MIXER

(75) Inventor: Vikas Choudhary, Coquitlam (CA)

(73) Assignee: PMC-Sierra, Inc., Sunnyvale, CA (US)

( * ) Notice: Subject to any disclaimer, the term of this patent is extended or adjusted under 35 U.S.C. 154(b) by 543 days.

(21) Appl. No.: 12/170,176

(22) Filed: Jul. 9, 2008

(51) Int. Cl.
*H04B 1/28* (2006.01)

(52) U.S. Cl. ..... 455/333; 455/326; 455/118; 455/248.1; 455/252.1

(58) Field of Classification Search .......... 455/313–333, 455/118, 248.1, 252.1
See application file for complete search history.

(56) References Cited

U.S. PATENT DOCUMENTS

| | | | |
|---|---|---|---|
| 4,918,532 A | 4/1990 | O'Connor | |
| 5,557,228 A * | 9/1996 | Liu | 327/355 |
| 5,602,504 A * | 2/1997 | Liu | 327/357 |
| 5,656,964 A * | 8/1997 | Liu | 327/357 |
| 5,884,154 A * | 3/1999 | Sano et al. | 455/321 |
| 6,016,426 A | 1/2000 | Bodell | |
| 6,230,001 B1 * | 5/2001 | Wyse | 455/326 |
| 6,300,845 B1 * | 10/2001 | Zou | 332/178 |
| 6,316,996 B1 * | 11/2001 | Puotiniemi | 330/254 |
| 6,324,391 B1 | 11/2001 | Bodell | |
| 6,377,315 B1 | 4/2002 | Carr et al. | |
| 6,631,257 B1 | 10/2003 | White et al. | |
| 6,650,883 B1 * | 11/2003 | Stephane et al. | 455/313 |
| 6,810,242 B2 * | 10/2004 | Molnar et al. | 455/326 |
| 6,813,485 B2 | 11/2004 | Sorrells et al. | |
| 6,879,816 B2 | 4/2005 | Bult et al. | |
| 7,065,162 B1 | 6/2006 | Sorrells et al. | |
| 7,092,043 B2 | 8/2006 | Vorenkamp et al. | |
| 7,177,616 B2 | 2/2007 | Connell et al. | |
| 7,177,620 B1 * | 2/2007 | Tsai et al. | 455/333 |
| 7,199,664 B2 | 4/2007 | Bult et al. | |
| 7,236,212 B2 | 6/2007 | Carr et al. | |
| 7,417,486 B2 * | 8/2008 | Koutani et al. | 327/359 |
| 7,440,742 B1 * | 10/2008 | Tsai et al. | 455/326 |
| 7,532,070 B2 * | 5/2009 | Cowley et al. | 330/254 |
| 7,689,194 B2 * | 3/2010 | Kivekas et al. | 455/313 |
| 7,929,938 B2 * | 4/2011 | Sellars et al. | 455/333 |
| 2005/0101280 A1 * | 5/2005 | Behzad | 455/293 |
| 2005/0272398 A1 * | 12/2005 | Chang et al. | 455/326 |
| 2008/0139164 A1 * | 6/2008 | Barre | 455/326 |
| 2009/0029668 A1 * | 1/2009 | Hsieh et al. | 455/324 |

OTHER PUBLICATIONS

Gilbert, et al.; "Fundamentals of Active Mixer"; Applied Microwave and Wireless; Winter 1995; pp. 10-27.

* cited by examiner

*Primary Examiner* — Edward Urban
*Assistant Examiner* — Rui Hu
(74) *Attorney, Agent, or Firm* — Knobbe Martens Olson & Bear LLP

(57) ABSTRACT

A mixer circuit suitable for broadband RF applications is disclosed. A unique biasing scheme for a conventional Gilbert-cell type 4-quadrant multiplier is used, resulting in relatively good linearity, relatively low noise, and relatively low power consumption. Disclosed techniques provide programmability in gain for the mixer and a broadband frequency of operation. A non-linear feedback loop is wrapped around the circuit to stabilize the common-mode voltage shifts due to programming. In one embodiment, a non-linear switch as load-resistance is used to improve the linearity of the circuit.

13 Claims, 6 Drawing Sheets

WIDEBAND MIXER

BACKGROUND

1. Field of the Invention

The invention generally relates to electronics. In particular, the invention relates to wideband mixers.

2. Description of the Related Art

Ever since its inception in the early 1900s by Edwin Armstrong, RF mixer technology has been at the heart of radio technology. However the utility of mixers has typically been relatively narrowband in frequency range due to the usage of discrete components, such as inductors.

In the field of radio frequency integrated circuits (RFIC), a mixer circuit is usually implemented as a Gilbert cell type current commutating approach. See, for example, Gilbert, et al., *Fundamentals of Active Mixer*, Applied Microwave and Wireless, 1995, 10-27. However, other implementation methods are possible. In a conventional Gilbert cell type of mixer, the input devices are biased in the saturation region of operation. This is done to derive maximum V-I (Voltage-Current) efficiency at RF. The conventional approach is fraught with inefficiency, such as relatively poor-linearity and relatively high power dissipation. The conventional approach also uses on-chip inductors, which results in a narrowband design and a relatively large die footprint. In spite of these drawbacks, the conventional technique gained popularity due to first few generations of RFIC being captive to bipolar devices, which are very efficient V-I converters and excellent current commutators.

However, CMOS devices are typically not as efficient as bipolar devices as V-I converters. One approach is to use the CMOS devices to switch voltages instead of current. Such techniques have their share of drawbacks, such as relatively poor voltage gain, relatively high noise to folding of noise from high frequency into baseband or intermediate frequency (IF), and the like etc.

Apart from the technological limitations of CMOS devices, a modern receiver front end should have a relatively wide dynamic range to accommodate the near-far end problem (faint RF signal versus a large interfering signal). Also, battery-operated portable RF systems should be efficient at using power.

SUMMARY

The invention includes a novel approach to a Gilbert cell type current commutating mixer. Embodiments of the invention are applicable for discrete or integrated implementation of any RF standard from about 500.0 MHz to 6.0 GHz. For example, embodiments are applicable to, but not limited to, the following: WiFi (802.11a/b/g), GSM, DECT, 802.16d/e, Zigbee, 4G-LTE, etc.

Embodiments of the invention can exhibit one or more of the following features: relatively wide-band mixer design (500.0 MHz to 6.0 GHz); relatively low power consumption; a space efficient design which does not need on-chip inductors; programmability in mixers to increase the dynamic range of RF front ends; and maintain large-signal linearity (for example, 1.0 dB compression point) across gain modes.

The invention includes a mixer circuit technique that is suitable for broadband RF applications. A biasing scheme for a conventional Gilbert-cell type 4-quadrant multiplier is disclosed. This biasing scheme results in relatively high linearity, relatively low-noise performance, and relatively low-power consumption. The biasing scheme also permits the gain of the mixer to be programmable and permits the mixer to have a relatively broadband frequency of operation. To stabilize the common-mode voltage, around a varying common-mode voltage due to changes in gain and due to the process, voltage and temperature (PVT) variations, a non-linear feedback loop is wrapped around the mixer circuit. A non-linear switch as a load-resistance can further be used to improve the linearity of the mixer circuit across a variety of gain conditions. One embodiment of the invention uses a 0.18 micrometer (μm), 2.5V, CMOS compatible process. Embodiments of the invention are applicable to a variety of wireless standards from 500.0 MHz up to 6.0 GHz.

BRIEF DESCRIPTION OF THE DRAWINGS

These drawings and the associated description herein are provided to illustrate embodiments of the invention and are not intended to be limiting.

DETAILED DESCRIPTION OF EMBODIMENTS

Embodiments of the invention are applicable to a mixer circuit design, such as in a down-converter, in a frequency range of about 500.0 MHz to 6.0 GHz. While illustrated in the context of a mixer circuit, the principles and advantages of linearity improvement through a non-linear switch, the non-linear feedback loop, and the biasing of selected transistors in the linear region of operation (for MOS) can be extended to other analog blocks, such as to low noise amplifiers (LNA), filters, and the like.

The problem of wide dynamic range and dynamic power requirement is typically addressed by providing gain programmability into an RF front end. While low noise amplifiers (LNAs) have lent themselves to such programmability, gain programmability in monolithic mixers has been elusive for two reasons. First, gain management at radio frequency (RF) typically deteriorates RF performance and typically uses multiple inductors. Second, gain management can result in a varying output common-mode voltage. A common-mode feedback loop can be used to correct the average output voltage. However, since a mixer is a time invariant system, a classical LTI analysis should not be applied for analyzing the feedback loop. A period steady state (PSS) analysis based approach (called PSS-PSTB) can be used for stability analysis of the mixer.

Gain programmability has other associated issues, such as difficulty in maintaining uniform noise-figure and linearity figures across different gain modes. For example, when the measurement numbers are reflected to the output, a linearity figure of merit, such as output third-order intercept point (oIP3), is scaled by the gain of the circuit. One approach to overcome the foregoing limitation is to design the circuit to comply with the demands for the lowest gain mode, which comes at the expense of excess power. A technique is disclosed wherein linearity is improved through the use of non-linear switch or active load. One embodiment of the invention uses a 0.18 μm, MOS, 2.5V process and advances the classical Gilbert cell type current commutating topology making it more suitable for MOS.

For a relatively low power, relatively low noise, and relatively highly linear circuit, it is desirable to bias the input devices of a MOS circuit into the linear region of operation instead of the conventional saturation region.

Figure 1:
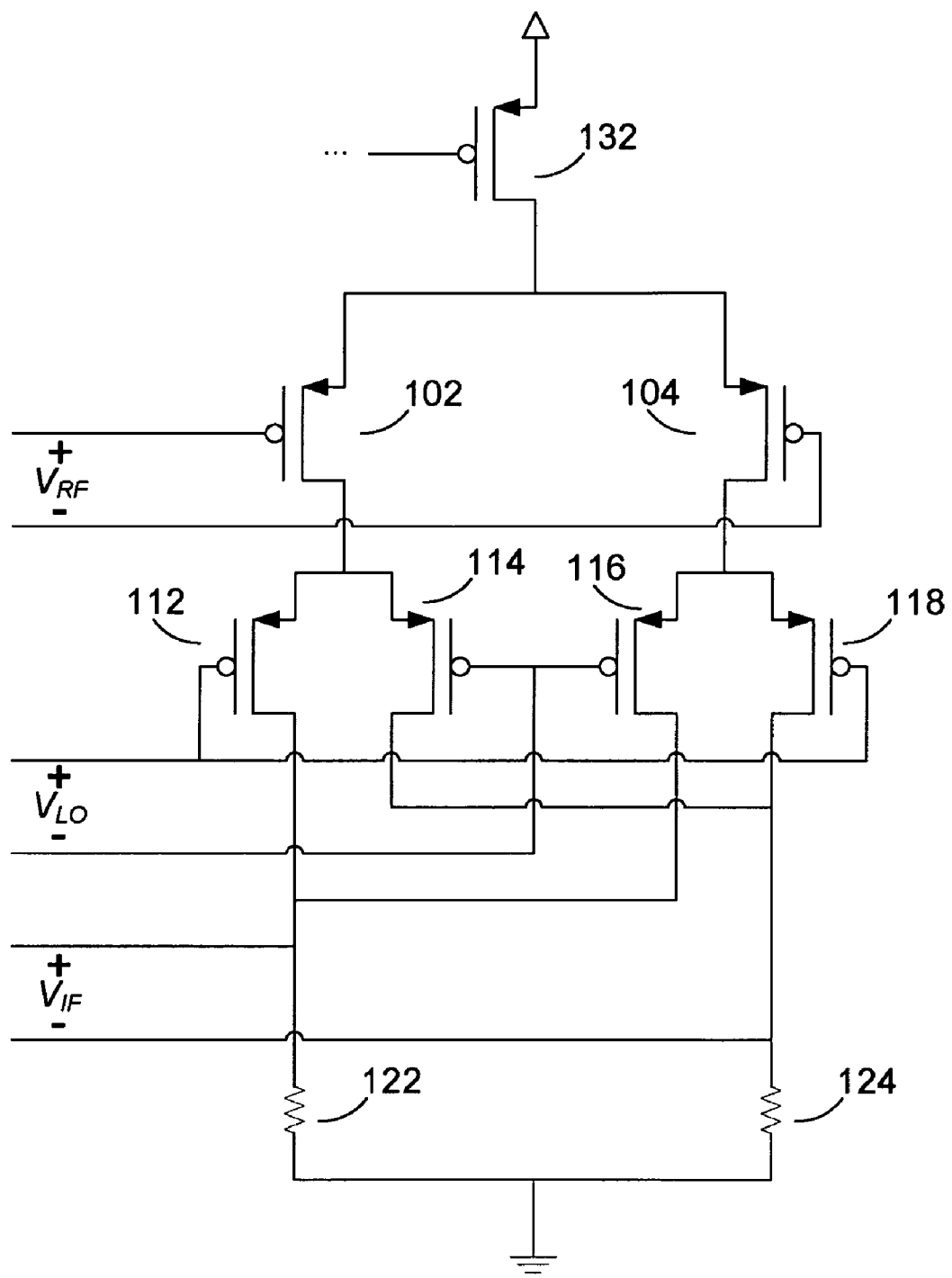
FIG. 1 illustrates a conventional Gilbert cell type current commutating mixer with selected input devices biased in the linear or ohmic region of operation instead of the conventional saturation region of operation.

FIG. 1 illustrates a MOS version of a current commutating mixer in which the input MOS devices 102, 104 for the RF input signal are biased in the linear region. The biasing scheme trades off gain at RF in lieu of better linearity and lower noise. The disclosed biasing technique lowers the power dissipation by lowering the dc bias current used to bias the MOS devices 102, 104.

In the modified Gilbert cell mixer illustrated in FIG. 1, the RF input signal $V_{RF}$ is applied as an input across the gates of the input MOS devices 102, 104 in a differential manner such that a non-inverted portion of the RF input signal $V_{RF}$ is applied to the gate of input MOS device 102 and an inverted portion of the RF input signal $V_{RF}$ is applied to the gate of input MOS device 104. The input MOS devices 102, 104 are equal in size and form a differential pair. The drain of the input MOS device 102 is coupled to the sources of MOS devices 112, 114. The drain of the input MOS device 104 is coupled to the sources of MOS devices 116, 118.

The local oscillator signal $V_{LO}$ is applied as an input across the gates of MOS devices 112, 114, 116, 118. A non-inverted portion of the local oscillator signal $V_{LO}$ is applied as an input to the gates of the MOS devices 112, 118. An inverted portion of the local oscillator signal $V_{LO}$ is applied as an input to the gates of the MOS devices 114, 116. The MOS devices 112, 114, 116, 118 mix the RF input signal $V_{RF}$ with the local oscillator signal $V_{LO}$ to generate an intermediate frequency signal $V_{IF}$.

The MOS devices 112, 114, 116, 118 are biased in the saturation region. The MOS devices 112, 114, 116, 118 are equal in size to each other. The MOS devices 112, 114 form a differential pair, and the MOS devices 116, 118 form another differential pair. The drains of the MOS devices 112, 116 are coupled to a first terminal of a resistor 122. A second terminal of the resistor 122 is coupled to a voltage reference such as ground. The drains of the MOS devices 114, 118 are coupled to a first terminal of a resistor 124. A second terminal of the resistor 124 is coupled to a voltage reference such as ground. A MOS device 132 provides a current source to the sources of the input MOS devices 102, 104. Of course, in an alternate embodiment wherein the PMOS transistors are replaced with NMOS and vice versa, the MOS device 132 will be a current sink. As used herein, the term "current source" will be applicable to both current sources and to current sinks Biasing for the MOS device 132 is not shown.

A non-inverting portion of the intermediate frequency signal $V_{IF}$ is available at a node formed by the drains of the MOS devices 112, 116 and the first terminal of the resistor 122. An inverting portion of the intermediate frequency signal $V_{IF}$ is available at a node formed by the drains of the MOS devices 114, 118 and the first terminal of the resistor 124. In one embodiment, the resistors 112, 114 are non-linear resistors as will be described in greater detail later in connection with FIGS. 2A and 2B.

MOS devices 102, 104 that are biased into the linear region (also known as ohmic region) of operation typically exhibit relatively good linearity. A MOS device biased into the linear region behaves as a resistor from drain to source. The output referred noise is curtailed due to low RF gain at this frequency.

In a Gilbert cell mixer, the convention had been to bias the input devices 102, 104 into the saturation region (also known as active region), which typically necessitates an inductive degeneration for linearization. However, the use of inductive degeneration results in a loss of wideband operation, inefficiently uses a large chip area, and complicates programmability for gain.

The biasing of MOS devices at RF into the linear region has many advantages. One drawback to the biasing into the linear region is a lower RF gain. However, the loss in RF gain can be recovered at baseband or intermediate frequency, as will be discussed in greater detail in the following.

While illustrated in the context of PMOS (p-type MOSFET) devices for MOS devices 102, 104, 112, 114, 116, 118, 132, and NMOS (n-type MOSFET) devices for an active load that will be described later, the principles and advantages are also applicable to the reverse configuration.

Figure 2A:
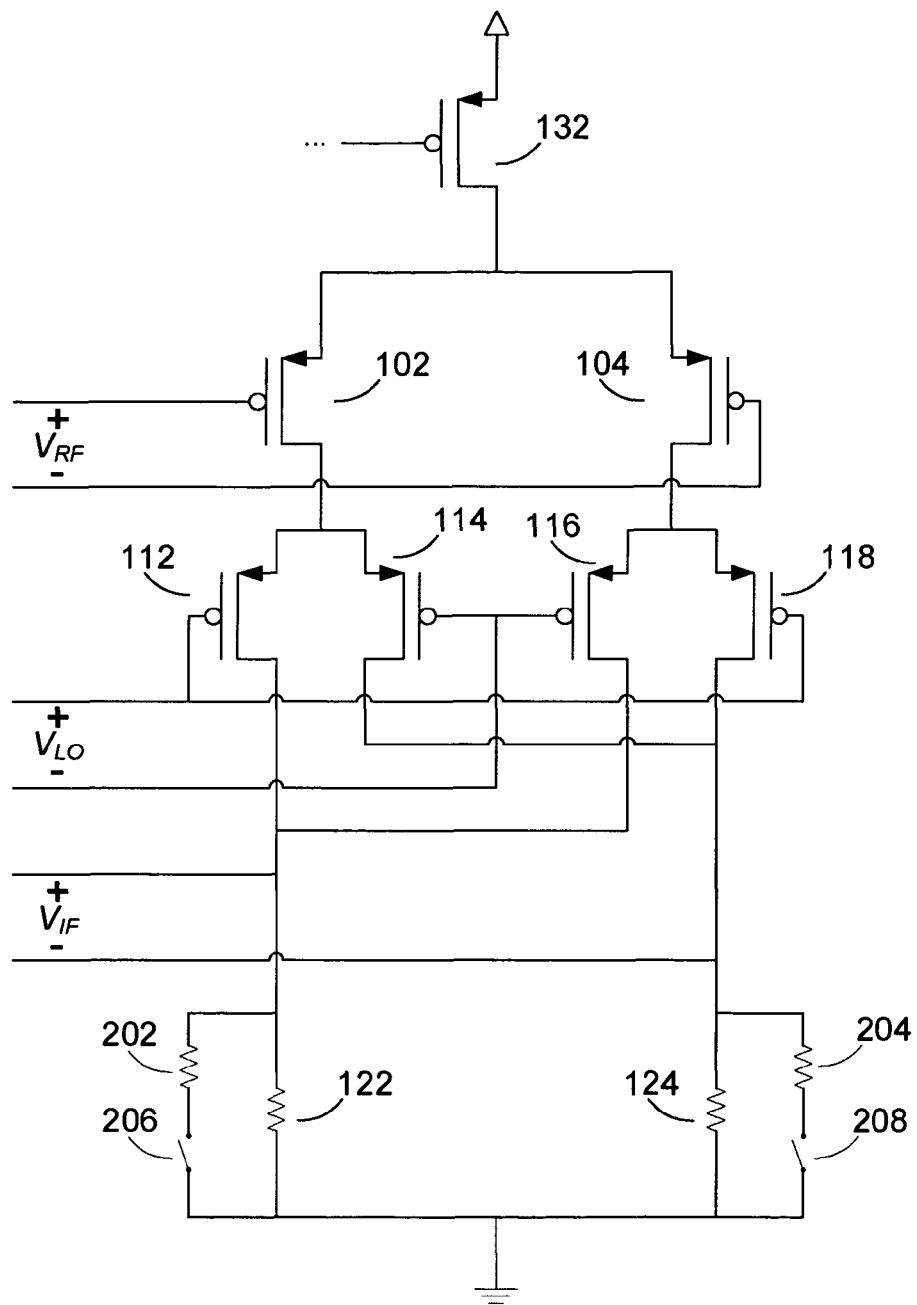
FIG. 2A illustrates gain programmability.

FIG. 2A illustrates gain programmability. While the low-power, low-noise and linearity advantages are provided by biasing of the input MOS devices 102, 104 in the linear or ohmic region as described earlier, the reduction in RF gain is recovered at baseband or intermediate frequency through a resistive load 122, 124, 202, 204, 206, 208 as shown in the embodiment illustrated in FIG. 2A. A resistive load can be used because the intermediate frequency signal $V_{IF}$ is in baseband, that is, has been downconverted to baseband. Thus, a resistor can be used to vary the gain of the signal content. For example, to implement gain programmability, various load devices can be switched as illustrated in FIG. 2A with the switches 206, 208, which can switch resistors 202, 204 in and out. In the illustrated embodiment, the switches 206, 208 are implemented using PMOS devices. In the conventional art, it is typical to use inductive degeneration. However, it can be complicated to implement gain programmability with inductors due to problems with linearity.

One difficulty encountered when switching resistive loads via switches such as MOS switches 206, 208 is that it affects the bias of the circuit and the common-mode voltage of the intermediate frequency signal $V_{IF}$ output. This can be overcome by adding a common-mode feedback circuit to control the common-mode voltage.

Figure 2B:
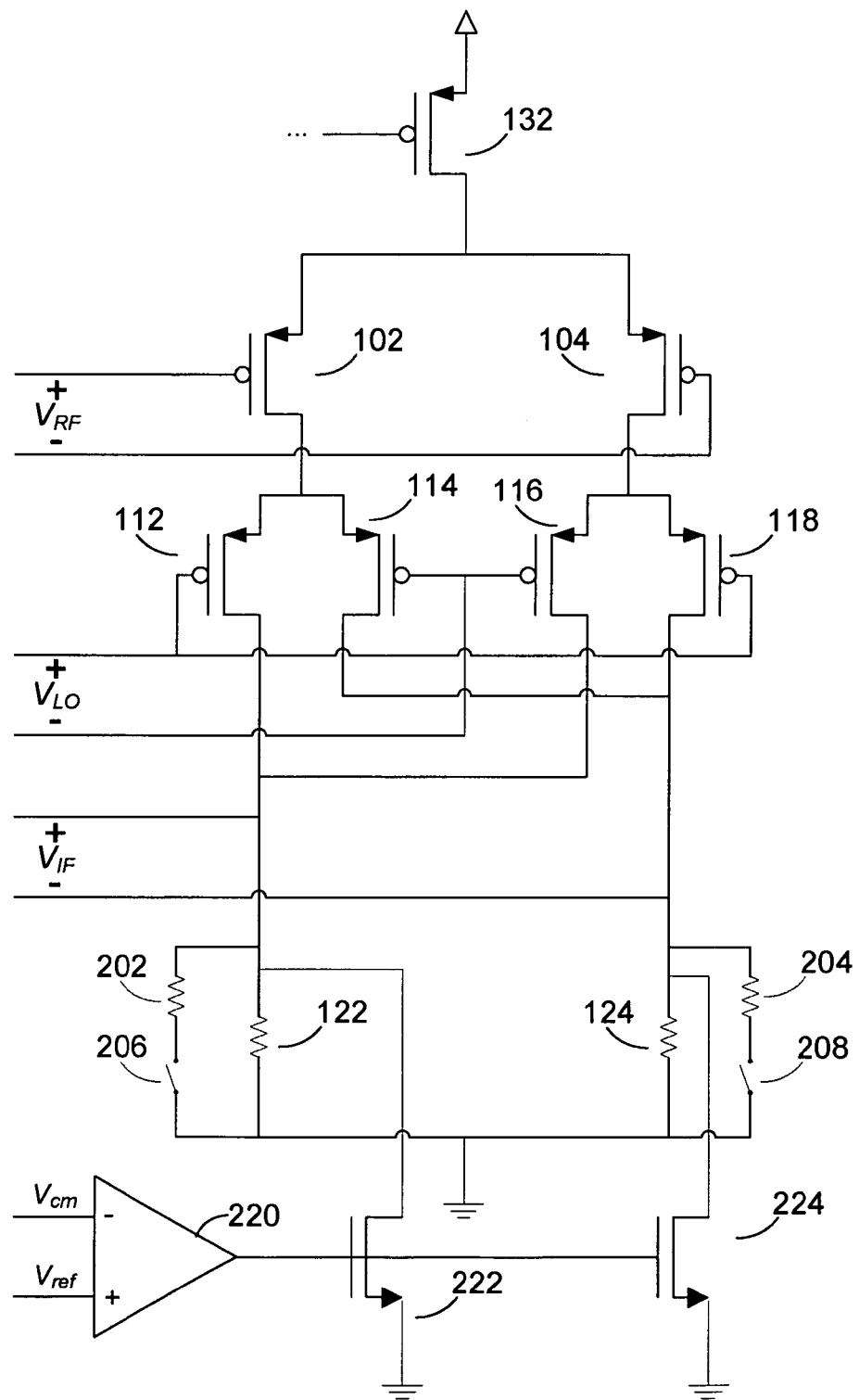
FIG. 2B illustrates a common-mode feedback circuit.

FIG. 2B illustrates a common-mode feedback circuit 220, 222, 224. Mixer circuits are time-varying circuits, so that linear time invariant (LTI) stability analysis should not be used. While a mixer circuit can be analyzed in transient domain, such analysis does not lend itself to a measure of stability. The illustrated circuit was analyzed using a period time stability (PSTB) method, which linearizes the circuit around a time-varying operating point, and then applies the stability measures.

The common-mode feedback circuit includes a differential amplifier 220, a first NMOS device 222, and a second NMOS device 224. In the illustrated embodiment, the common-mode voltage for the intermediate frequency signal $V_{IF}$ can be provided as an input to an inverting input of the differential amplifier 220. In one embodiment, a summing circuit is used to generate the common-mode voltage for the intermediate frequency signal $V_{IF}$. A reference voltage, which can correspond to the desired level of the common-mode voltage, can be provided as an input to the non-inverting input of the differential amplifier 220. An output of the differential amplifier 220 drives gates of the first NMOS device 222 and the second NMOS device 224. In an alternative configuration, the first NMOS device 222 and the second NMOS device 224 are PMOS devices.

A possible issue with gain programmability is the loss of large signal linearity, for example, as measured by an output 1 dB (oP1 dB) compression point, when referenced to the output. Even though linearity of devices is maintained, when referenced to the output through the gain of the circuit, the figure of merit is scaled by the gain of the circuit.

One traditional design approach has been to overdesign the circuits for the most stringent of conditions, which typically wastes power and chip area. One embodiment of the invention utilizes the non-linearity of the MOS devices 206, 208 as illustrated by the chart in FIG. 3A.

Figure 3A:
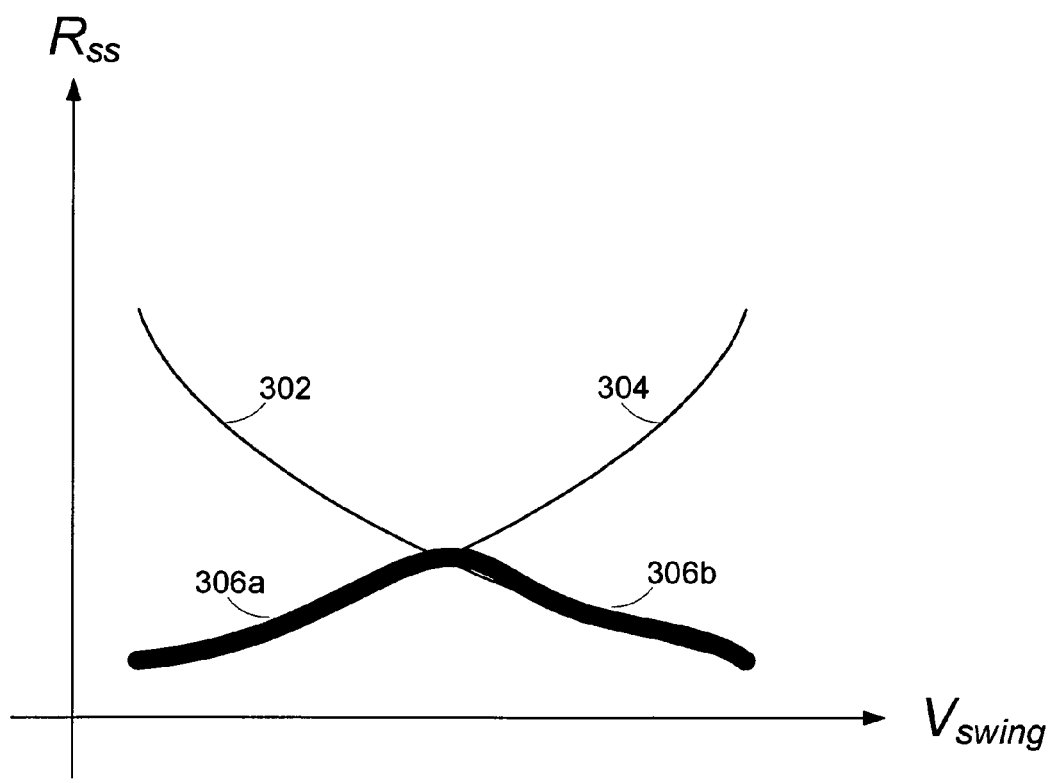
FIG. 3A illustrates linearity compensation by utilizing the non-linearity of the switches.

FIG. 3A illustrates linearity compensation by utilizing the non-linearity of the switches 206, 208. A typical MOS switch (MOS device turned "on" into the linear or ohmic region) has a resistance $R_{SS}$ versus voltage swing $V_{swing}$ characteristics as shown in FIG. 3A. FIG. 3A illustrates a first curve 302 of the resistance of an NMOS device and a second curve 304 of the resistance of a PMOS device. A bold curve 306a, 306b represents a combined resistance. For proper operation, the switches should be biased in the expansive regime of operation, which in this case is on the left half 306a of the bold curve 306a, 306b.

Thus, when the input signal to the mixer circuit is relatively large and a low gain mode would be typically used, the expansive nature of the switches 206, 208 compensate for the compressive nature of the transistors 102, 104, 112, 114, 116, 118 in general, thereby delaying the onset of compression. This is further elaborated in FIG. 3B.

Figure 3B:
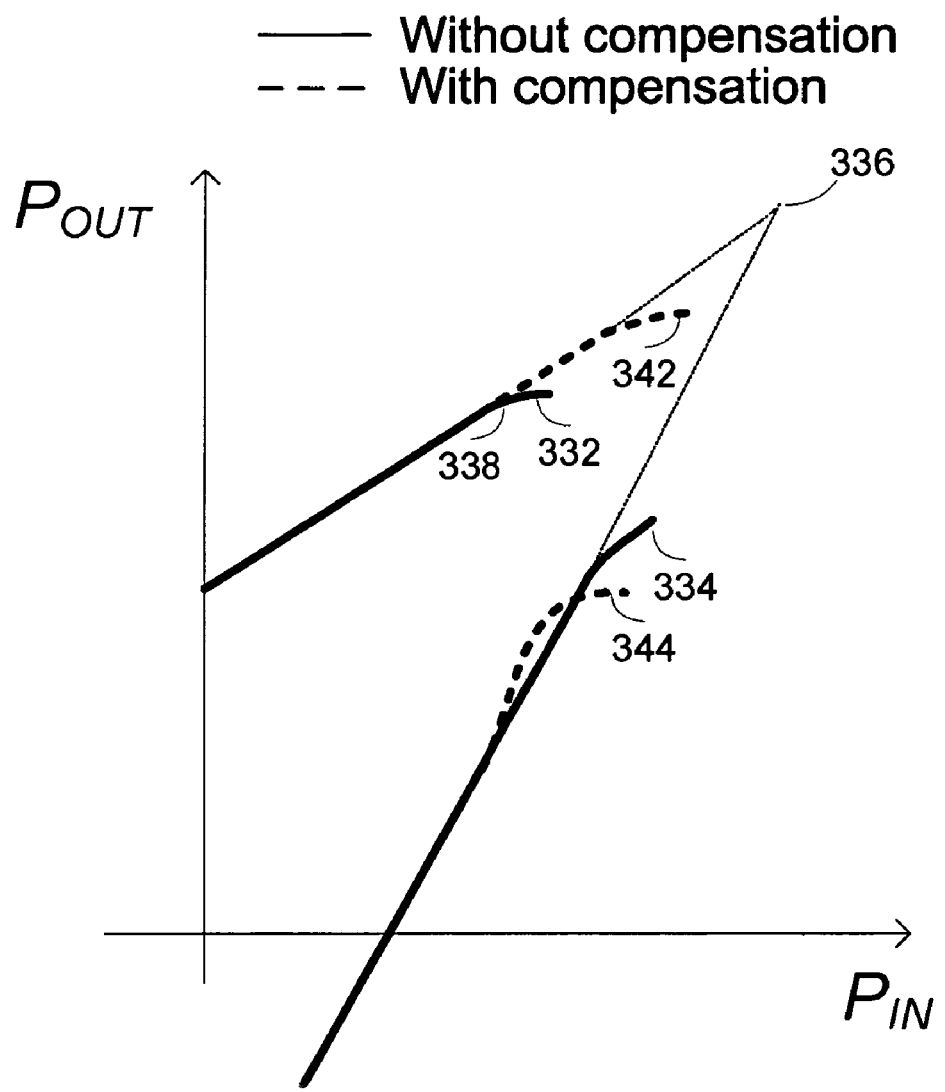
FIG. 3B illustrates an improvement in an output power 1 dB (oP 1 dB) compression point.

FIG. 3B illustrates an improvement in an output power 1 dB (oP1 dB) compression point. The solid curves 332, 334 trace the first order and third order components of the mixer circuit in the absence of any linearity compensation. The upper solid curve 332 represents the first order (the gain of the circuit) while the lower solid curve 334 represents the non-linear third order component. The point of intersection 336 of extrapolations of the two curves 332, 334 is the third-order intercept point (IP3) of the circuit, whereas the point 338 where the topmost curve 332 bends down by 1.0 dB is the 1 dB compression of the circuit. Depending on the axis to which the quantities are referred (input or output), the corresponding figure of merit would be called either input 1 dB (i1 dB) or output 1 dB (o1 dB) compression points.

The dashed curves 342, 344 represent harmonic components in the presence of the linearity compensation by expansive switch 206, 208 characteristics. Due to the expansive resistance nature of the switches 206, 208 themselves, when input power level is increased, the gain (first order component) is further compensated thereby delaying the onset of the 1 dB compression point. This however does come at the expense of inserting further non-linearity in the mixer circuit which is exhibited by the distortion in $3^{rd}$ order component (the dashed lower curve 344). However the low-signal linearity (measured by intersection of extrapolated $1^{st}$ and $3^{rd}$ order components from low power levels) are still undisturbed and the IP3 of the circuit can still be maintained if the biasing is proper.

Figure 4:
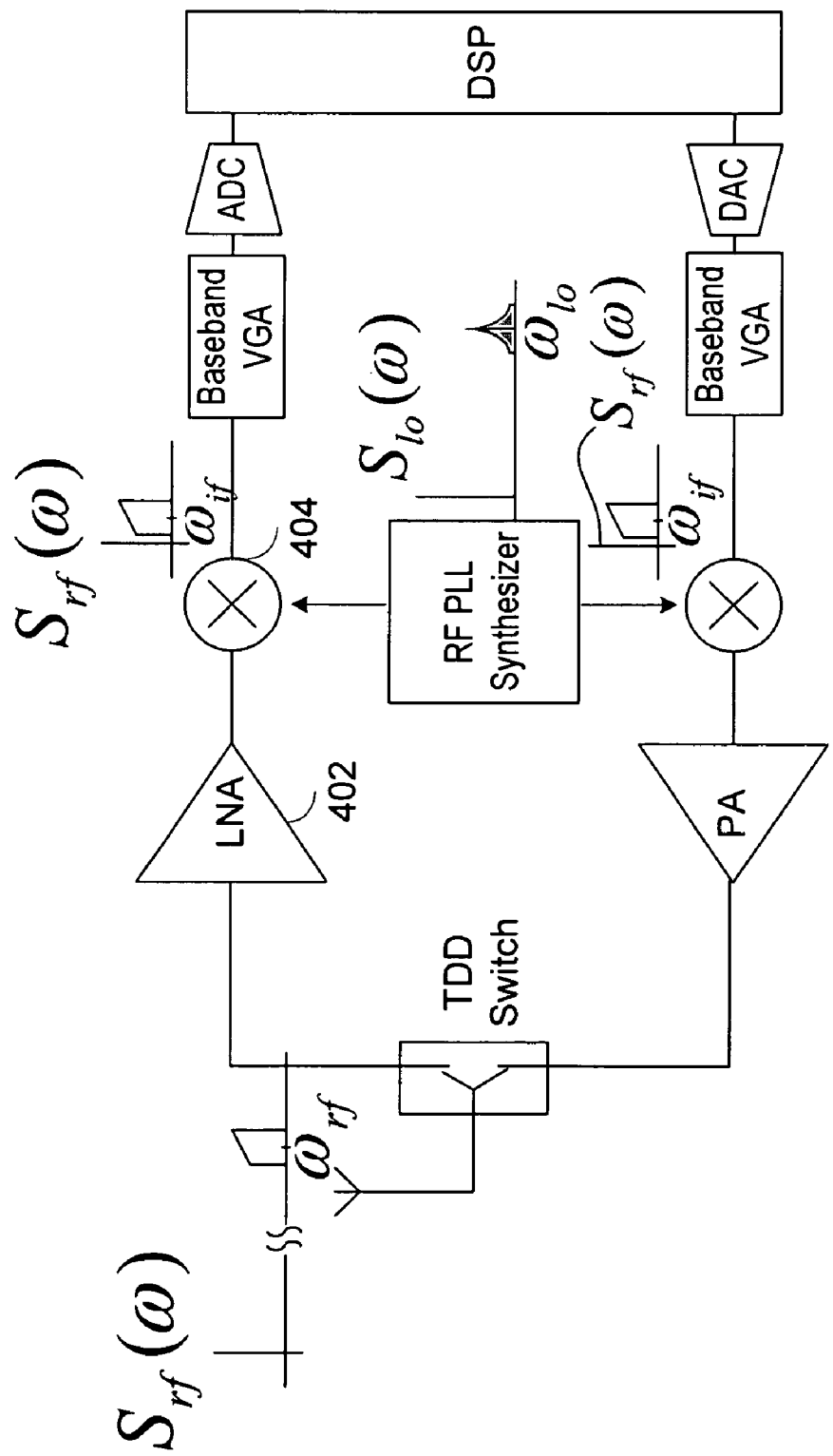
FIG. 4 illustrates a broadband RF mixer in a monolithic implementation of radio front end in which an embodiment of the mixer circuit can be used.

FIG. 4 illustrates a broadband RF mixer in a monolithic implementation of radio front end in which an embodiment of the mixer circuit can be used. The implementation style could be either heterodyne (intermediate IF) or homodyne (zero IF) radio. The circuit following the low noise amplifier (LNA) 402 is a downconverter 404 in which an embodiment of the invention can be used.

Various embodiments have been described above. Although described with reference to these specific embodiments, the descriptions are intended to be illustrative and are not intended to be limiting. Various modifications and applications may occur to those skilled in the art.

What is claimed is:

1. An apparatus comprising:
    a mixing cell comprising a first MOS transistor, a second MOS transistor, a third MOS transistor, a fourth MOS transistor, a fifth MOS transistor, and a sixth MOS transistor, each of which is of a first semiconductor type;
        wherein the first MOS transistor is configured to be biased in the linear region of operation, wherein a gate of the first MOS transistor is coupled to a first portion of a first signal;
        wherein the second MOS transistor is configured to be biased in the linear region of operation, wherein a gate of the second MOS transistor is coupled to a second portion of the first signal, wherein the second portion is inverted with respect to the first portion;
        wherein the third MOS transistor is configured to be biased in the saturation region, wherein a gate of the third MOS transistor is coupled to a first portion of a second signal, wherein a source of the third MOS transistor is coupled to a drain of the first MOS transistor;
        wherein the fourth MOS transistor is configured to be biased in the saturation region, wherein a gate of the fourth MOS transistor is coupled to a second portion of the second signal, wherein the second portion is inverted with respect to the first portion, wherein a source of the fourth MOS transistor is coupled to the drain of the first MOS transistor;
        wherein the fifth MOS transistor is configured to be biased in the saturation region, wherein a gate of the fifth MOS transistor is coupled to the second portion of the second signal, wherein a source of the fifth MOS transistor is coupled to a drain of the second MOS transistor;
        wherein the sixth MOS transistor is configured to be biased in the saturation region, wherein a gate of the sixth MOS transistor is coupled to the first portion of the second signal, wherein a source of the sixth MOS transistor is coupled to the drain of the second MOS transistor;
    a seventh MOS transistor of the first semiconductor type with a drain coupled to a source of the first MOS transistor and to a source of the second MOS transistor, wherein the seventh MOS transistor is configured to be a current source or a current sink;
    a first load having a first node and a second node, wherein the first node is coupled to a drain of the third MOS transistor and to a drain of the fifth MOS transistor, wherein the second node is coupled to a voltage reference; and
    a second load having a first node and a second node, wherein the first node is coupled to a drain of the fourth MOS transistor and to a drain of the sixth MOS transistor, wherein the second node is coupled to the voltage reference;
    wherein a first portion of a third signal is available at the first node of the first load and wherein a second portion of the third signal is available at the first node of the second load, wherein the second portion is inverted with respect to the first portion;
    wherein each of the first load and the second load comprises a load with a first node and a second node, the load further comprising:
        a first resistor having a first node and a second node, the first node of the first resistor coupled to the first node of the load, the second node of the first resistor coupled to the second node of the load;

a second resistor having a first node and a second node, the first node of the second resistor coupled to the first node of the load; and a MOS transistor of a second semiconductor type different from the first semiconductor type, wherein the MOS transistor is configured as a switch, wherein a drain of the MOS transistor is coupled to the second node of the second resistor, wherein a source of the MOS transistor is coupled to the second node of the load, and wherein a gate of the MOS transistor is coupled to a control for selection of a gain of the mixing cell.

2. The apparatus of claim 1, further comprising a common-mode feedback circuit comprising:

a differential amplifier having a first input, a second input, and an output, wherein the first input is coupled to a source for a common-mode voltage of the third signal, the second input is coupled to a reference voltage for a desired common-mode voltage;

a first feedback-circuit MOS transistor having a gate coupled to the output of the differential amplifier, a drain coupled to the first node of the first load; and a second feedback-circuit MOS transistor having a gate coupled to the output of the differential amplifier, a drain coupled to the first node of the second load.

3. The apparatus of claim 1, further comprising a common-mode feedback circuit comprising:

a differential amplifier having a first input, a second input, and an output, wherein the first input is coupled to a source for a common-mode voltage of the third signal, the second input is coupled to a reference voltage for a desired common-mode voltage;

a first feedback-circuit MOS transistor having a gate coupled to the output of the differential amplifier, a drain coupled to the first node of the first load; and a second feedback-circuit MOS transistor having a gate coupled to the output of the differential amplifier, a drain coupled to the first node of the second load.

4. The apparatus of claim 1, wherein each of the first load and the second load are inductorless.

5. The apparatus of claim 1, wherein the first signal is an RF input signal, the second signal is a local oscillator signal, and the third signal is an intermediate frequency or baseband frequency signal.

6. The apparatus of claim 1, wherein the first resistor is in parallel with a series combination of the second resistor and the MOS transistor.

7. The apparatus of claim 1, wherein the first portion of the first signal corresponds to a non-inverted portion of the first signal; wherein the second portion of the first signal corresponds to an inverted portion of the first signal; wherein the first portion of the second signal corresponds to a non-inverted portion of the second signal; wherein the second portion of the second signal corresponds to an inverted portion of the second signal; wherein the first portion of the third signal corresponds to a non-inverted portion of the third signal; wherein the second portion of the third signal corresponds to an inverted portion of the third signal.

8. A method of operating a Gilbert cell mixer circuit, the Gilbert cell mixer circuit comprising a first differential pair of MOS transistors, a second differential pair of MOS transistors, and a third differential pair of MOS transistor, the method comprising:

biasing the first differential pair into the linear or ohmic region and not to the saturation region, wherein a gate of a first MOS transistor of the first differential pair is coupled to a first portion of a first signal, and wherein a gate of a second MOS transistor of the first differential pair is coupled to a second portion of a first signal;

biasing the second differential pair into the saturation region, wherein sources of the second differential pair are coupled to a drain of the first MOS transistor of the first differential pair;

biasing the third differential pair into the saturation region, wherein sources of the third differential pair are coupled to a drain of the second MOS transistor of the first differential pair;

wherein a gate of a first MOS transistor of the second differential pair and a gate of a second MOS transistor of the third differential pair are coupled to a first portion of a second signal;

wherein a gate of a second MOS transistor of the second differential pair and a gate of a first MOS transistor of the third differential pair are coupled to a second portion of the second signal;

wherein a first portion of a third signal is available at a first node coupling a drain of the first MOS transistor of the second differential pair and a drain of the first MOS transistor of the third differential pair and wherein a second portion of the third signal is available at a drain of the second MOS transistor of the second differential pair and a drain of the second MOS transistor of the third differential pair; and controllably switching an amount of load resistance applied to sources of the second differential pair and the third differential pair to change a gain associated with the Gilbert cell mixer circuit.

9. The method of claim 8, wherein the first signal is an RF input signal, the second signal is a local oscillator signal, and the third signal is an intermediate frequency or baseband frequency signal.

10. The method of claim 8, further comprising controlling a common-mode voltage of the third signal, the method further comprising:

comparing the common-mode voltage of the third signal to a reference voltage; and using feedback control based on the comparison to generate a control voltage for gates of a first feedback-circuit transistor and a second feedback-circuit transistor for control of the common mode voltage of the third signal.

11. The method of claim 8, further comprising controlling a common-mode voltage of the third signal, the method further comprising:

comparing the common-mode voltage of the third signal to a reference voltage; and using feedback control based on the comparison to generate a control voltage for gates of a first feedback-circuit transistor and a second feedback-circuit transistor for control of the common mode voltage of the third signal.

12. The method of claim 8, wherein a first resistor is in parallel with a series combination of a second resistor and a MOS transistor, wherein switching further comprises switching the MOS transistor.

13. The method of claim 8, wherein the first portion of the first signal corresponds to a non-inverted portion of the first signal; wherein the second portion of the first signal corresponds to an inverted portion of the first signal; wherein the first portion of the second signal corresponds to a non-inverted portion of the second signal; wherein the second portion of the second signal corresponds to an inverted portion of the second signal; wherein the first portion of the third signal corresponds to a non-inverted portion of the third signal; wherein the second portion of the third signal corresponds to an inverted portion of the third signal.

* * * * *